(12) United States Patent
Fujii et al.

(10) Patent No.: US 7,436,007 B2
(45) Date of Patent: Oct. 14, 2008

(54) MASTER SLICE TYPE SEMICONDUCTOR INTEGRATED CIRCUIT DEVICE

(75) Inventors: Shinji Fujii, Yokohama (JP); Toshiki Morimoto, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 194 days.

(21) Appl. No.: 11/480,559

(22) Filed: Jul. 5, 2006

(65) Prior Publication Data

US 2007/0007549 A1    Jan. 11, 2007

(30) Foreign Application Priority Data

Jul. 6, 2005    (JP) .............................. 2005-197828

(51) Int. Cl.
*H01L 27/10*    (2006.01)
(52) U.S. Cl. ................................. 257/202; 257/E23.01
(58) Field of Classification Search ................. 257/207, 257/208, E23.01, 202
See application file for complete search history.

(56) References Cited

U.S. PATENT DOCUMENTS 5,367,187 A * 11/1994 Yuen .......................... 257/401

6,603,158 B1 * 8/2003 Kajii et al. ................... 257/206

FOREIGN PATENT DOCUMENTS

JP    07-321210    12/1995

* cited by examiner

*Primary Examiner*—Louie Wai-Sing
*Assistant Examiner*—Bilkis Jahan
(74) *Attorney, Agent, or Firm*—Banner & Witcoff, Ltd

(57) ABSTRACT

A plurality of terminals is formed in a basic cell. One terminal has first to fifth patterns. The first and second patterns are arranged to be spaced from each other. The third and fourth patterns are arranged to be spaced from each other, and are arranged so as to be adjacent to the first and second patterns. The fifth pattern is arranged between the first and second grid lines to interconnect the first to fourth patterns. A dimension of the fifth pattern in a direction of extension of a plurality of grid lines is set to be smaller than a dimension obtained by adding dimensions of the first and second patterns in the direction of extension of the grid lines to an interval of the both patterns, and a dimension obtained by adding dimensions of the third and fourth patterns to an interval of the both patterns.

8 Claims, 3 Drawing Sheets

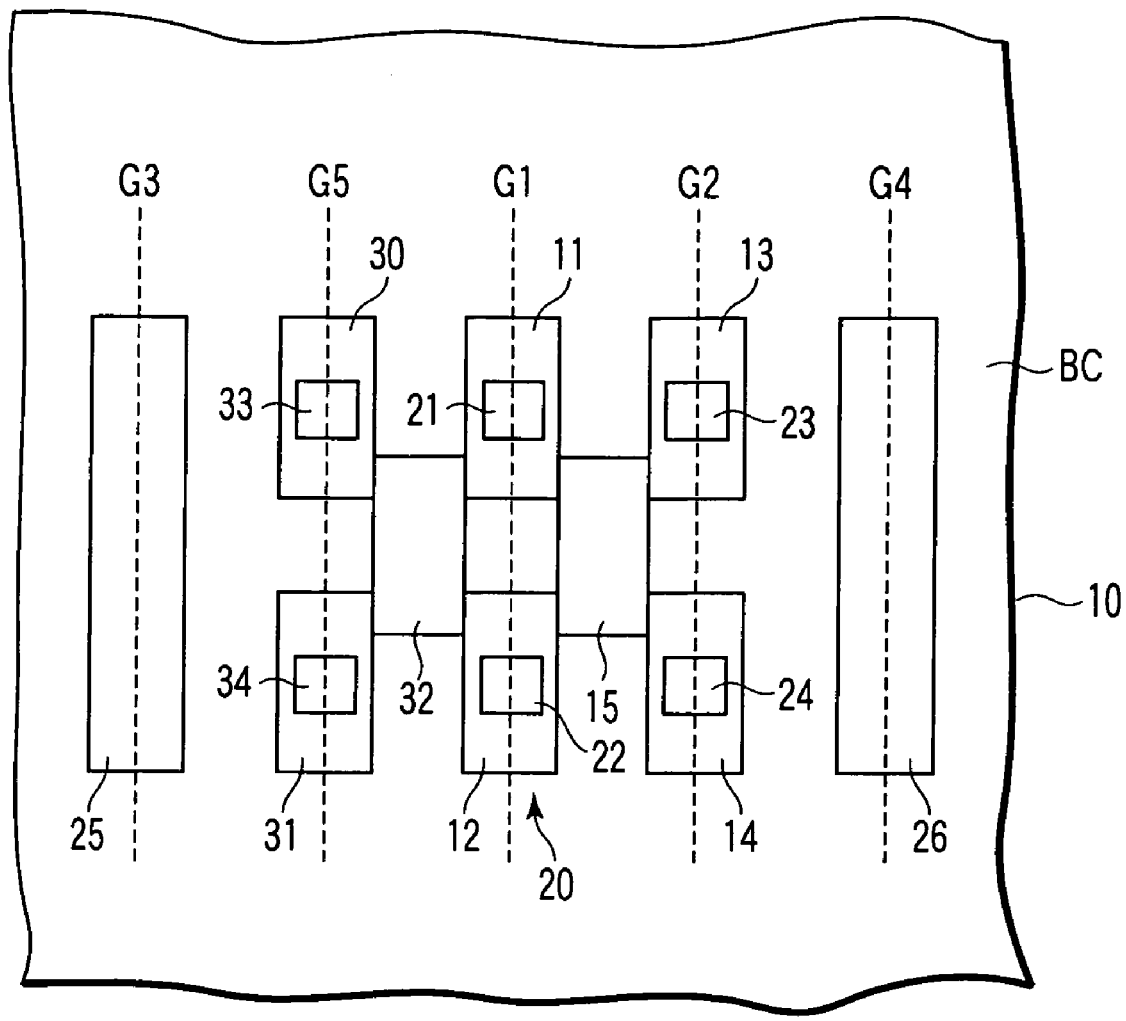
F I G. 5

US 7,436,007 B2

MASTER SLICE TYPE SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-197828, filed Jul. 6, 2005, the entire contents of which are incorporated herein by reference.

BACKGROUND OF THE INVENTION

1. Field of the Invention

The present invention relates to a master slice type semiconductor integrated circuit device having a plurality of basic cells formed therein, and in particular, to a shape of the basic cells.

2. Description of the Related Art

A master slice type semiconductor integrated circuit device has been known in which source/drain diffusion regions and a gate electrode of a transistor, and a plurality of basic cells are prepared in advance, the basic cells having a plurality of terminals composed of a metal layer of the first layer electrically connected respectively to the source/drain diffusion region and the gate electrode. In the master slice type semiconductor integrated circuit device, an attempt is made to shorten a delivery period of products by forming upper layer wirings by using metal layers on and after the second layer in accordance with an order of a customer. In the master slice type semiconductor integrated circuit device, upper layer wirings of the layers on and after the second layer are designed and arranged along grid lines imagined on a semiconductor substrate by use of an automatic wiring design technique using an electronic computer. Usually, the grid lines are constituted by grid lines in a horizontal direction and a vertical direction. When a wiring pitch between the upper layer wirings of the layers on and after the second layer which are formed in a master slice system is narrower than a wiring pitch between the terminals composed of a metal layer of the first layer, a degree of freedom in connections between the basic cells and the upper layer wirings is improved by making a planar shape of a terminal as large as possible. However, when a planar shape of a terminal is simply made larger, a design rule violation which is a multispace violation in metal wiring is brought about. Then, other terminals cannot be arranged along a grid positioned so as to be adjacent to the terminal.

When a planar shape of a terminal is made to be an H shape in order to avoid a multispace violation, a pattern which is minute in design is made thicker under the influence of rounding. In this case, short circuit is brought about with an adjacent terminal, which is at risk for reducing an yield.

As the miniaturization in wiring has been made to progress, optical proximity correction (OPC) due to rounding of a minute pattern has been made more difficult, which makes complete correction difficult. Namely, a planar shape of a terminal cannot be made larger because there is a risk of short circuit. For this reason, a degree of freedom in connections between the basic cells and the upper layer wirings is impaired, which brings about an increase in a cell size depending on a logic circuit.

Note that Jpn. Pat. Appln. KOKAI Publication No. 7-321210 discloses a semiconductor integrated circuit device having the following configuration. That is, by an automatic wiring design technique using an electronic computer, a first wiring is used in a horizontal direction, a second wiring is used in a vertical direction, and via holes which connect both of the first and second wirings are arranged at regions where the directions of the wirings are switched. Generation of un-connection brought about due to a restriction of the layout of via holes is reduced by allowing the first wiring to be used in a vertical direction and also allowing the second wiring to be used in a horizontal direction on one grid line.

BRIEF SUMMARY OF THE INVENTION

According to an aspect of the present invention, there is provided a master slice type semiconductor integrated circuit device comprising: a basic cell formed on a semiconductor substrate, a plurality of grid lines including first to fourth grid lines which extend in a same direction being imagined on the semiconductor substrate, the basic cell having a plurality of terminals arranged along the plurality of grid lines and respectively composed of a metal layer, wherein at least one terminal of the plurality of terminals includes: first and second patterns which are arranged on the semiconductor substrate, the first and second patterns being spaced from each other along the first grid line; third and fourth patterns which are arranged on the semiconductor substrate, the third and fourth patterns being spaced from each other along the second grid line adjacent to the first grid line, and the third and fourth patterns being adjacent to the first and second patterns; and a fifth pattern which is arranged between the first and second grid lines, and is arranged on the semiconductor substrate interconnecting the first, second, third and fourth patterns, a dimension of the fifth pattern in a direction of extension of the plurality of grid lines being set to be smaller than a dimension obtained by adding dimensions of the first and second patterns in the direction of extension of the plurality of grid lines to an interval between the both patterns, and a dimension obtained by adding dimensions of the third and fourth patterns in the direction of extension of the plurality of grid lines to an interval between the both patterns.

BRIEF DESCRIPTION OF THE SEVERAL VIEWS OF THE DRAWING

FIG. 5 is a pattern plan view of a basic cell according to a second modified example of the first embodiment.

DETAILED DESCRIPTION OF THE INVENTION

First Embodiment

Figure 1:
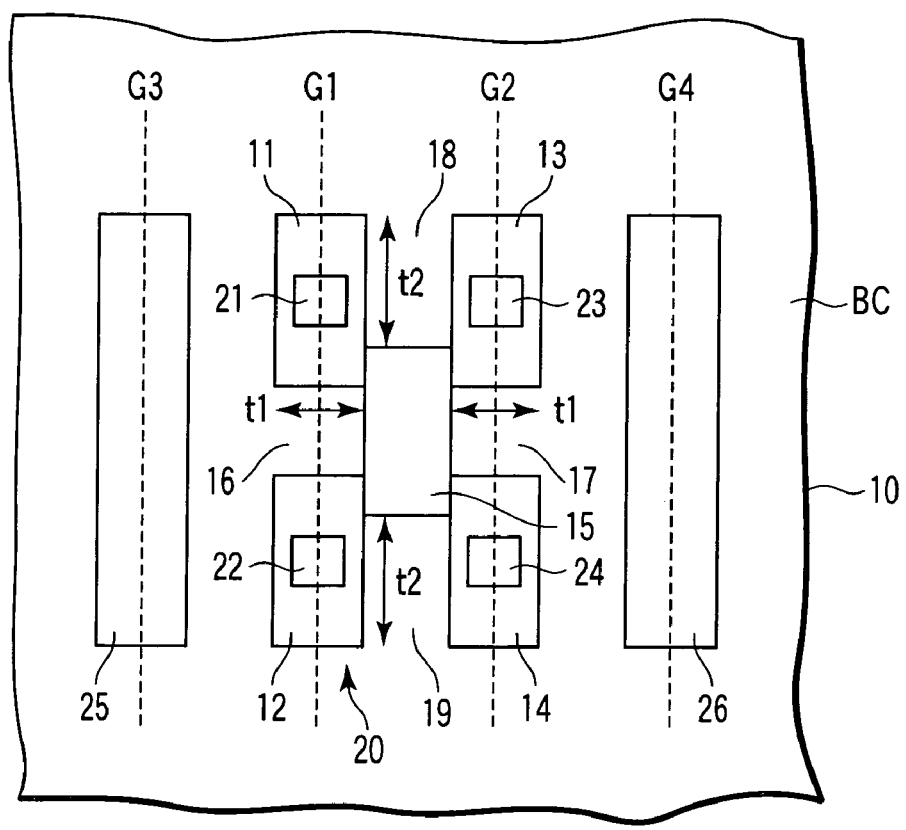
FIG. 1 is a pattern plan view of s basic cell according to a first embodiment of the present invention.

FIG. 1 is a pattern plan view of a basic cell according to a first embodiment of a master slice type semiconductor integrated circuit device of the present invention. A basic cell BC is formed on a semiconductor substrate 10. In the basic cell BC, a source region, a drain region, and a gate electrode of a transistor are formed. A plurality of terminals respectively composed of a metal layer of the first layer is formed, the terminals being electrically connected to the source region, drain region, and gate electrode. The automatic wiring design technique using an electronic computer is employed to arrange upper layer wirings of layers on and after the second layer along a plurality of grid lines imagined on the semiconductor substrate 10. The upper layer wirings of the layer on and after the second layer are arranged along the grid lines in a horizontal direction and a vertical direction. In FIG. 1, for example, a plurality of grid lines G1 to G4 in a vertical direction are shown by broken lines. The upper layer wirings of the layers on and after the second layer are selectively connected to the plurality of terminals composed of the metal layer of the first layer to constitute a logic circuit.

One terminal of the plurality of terminals composed of the metal layer of the first layer is configured as follows. A first pattern 11 and a second pattern 12 are arranged along the first grid line G1. The first and second patterns 11 and 12 are spaced from each other. A third pattern 13 and a fourth pattern 14 are arranged along the second grid line G2 adjacent to the first grid line G1. The third and fourth patterns 13 and 14 are spaced from each other. Further, the third and fourth patterns 13 and 14 are adjacent to the first and second patterns 11 and 12. A fifth pattern 15 is arranged between the first and second grid lines G1 and G2 so as to interconnect the first, second, third, and fourth patterns 11 to 14. A dimension of the fifth pattern 15 in a direction of extension of the plurality of grid lines G1 to G4 is smaller than a dimension obtained by adding dimensions of the first and second patterns 11 and 12 in a direction of extension of the grid lines to an interval between the both patterns, and a dimension obtained by adding dimensions of the third and fourth patterns 13 and 14 in a direction of extension of the grid lines to an interval between the both patterns.

The first to fifth patterns 11 to 15 are arranged along the grid lines G1 and G2 adjacent to each other. A first concave portion 16 in a square shape is provided at the central portion in a region along a direction of extension of the grid line G1, and a second concave portion 17 in a square shape is provided at the central portion in a region along a direction of extension of the grid line G2. Further, a third concave portion 18 and a fourth concave portion 19 in square shapes are provided at the both end portions along a direction of extension of the grid line in regions positioned between the both grid lines G1 and G2. Consequently, a terminal 20 with a large planar shape is configured in its entirety. Namely, the first concave portion 16 is formed at a region defined by the first, second and fifth patterns 11, 12 and 15; the second concave portion 17 is formed at a region defined by the third, fourth and fifth patterns 13, 14 and 15; the third concave portion 18 is formed at a region defined by the first, third and fifth patterns 11, 13 and 15; and the fourth concave portion 19 is formed at a region defined by the second, fourth and fifth patterns 12, 14 and 15.

Further, via contact formation regions (regions scheduled to form via contacts) 21 to 24 in which via contacts to be electrically connected to the upper layer wirings can be formed are provided on the first to fourth patterns 11 to 14.

Moreover, a terminal 25 composed of the metal layer of the first layer is arranged along the grid line G3 adjacent to the grid line G1. Further, a terminal 26 composed of the metal layer of the first layer is arranged along the grid line G4 adjacent to the grid line G2. The terminals 25 and 26 are electrically connected to, for example, the gate electrode among the source region, the drain region, and the gate electrode of the transistor in the basic cell.

The terminal 20 including the first to fifth patterns 11 to 15 has a large planar shape extending over the two grid lines. Therefore, when a logic circuit is configured by connecting the upper layer wirings of the layers on and after the second layer to the terminal 20, a degree of freedom in connections with the upper layer wirings can be sufficiently insured because the planar shape of the terminal 20 is large. In addition, the concave portion 16 is arranged between the first pattern 11 and the second pattern 12, and the concave portion 17 is arranged between the third pattern 13 and the fourth pattern 14 which are arranged so as to be adjacent to the first and second patterns 11 and 12. Furthermore, the third concave portion 18 and the fourth concave portion 19 are arranged at the both end portions of the fifth pattern 15. Both of the dimensions t1 of the concave portions 16 and 17, and the dimensions t2 of the concave portions 18 and 19 are set to be extremely greater than a correction dimension by OPC. For example, t1 is set to be equal to a dimension of the first and second patterns 11 and 12 in a direction perpendicular to the direction of extension of the grid lines, i.e., a width of the first and second patterns 11 and 12, and t2 is set to be a value greater than the width of the first and second patterns 11 and 12.

Therefore, even if OPC is not sufficiently performed on the terminal 20, influence due to rounding makes it possible to eliminate a risk that the terminal 20 short-circuits with the terminals 25 and 26 arranged along the adjacent grid lines G3 and G4.

Namely, according to the present embodiment, a degree of freedom in connections between the terminal 20 and the upper layer wirings can be insured without increase in a cell size.

Second Embodiment

Figure 2:
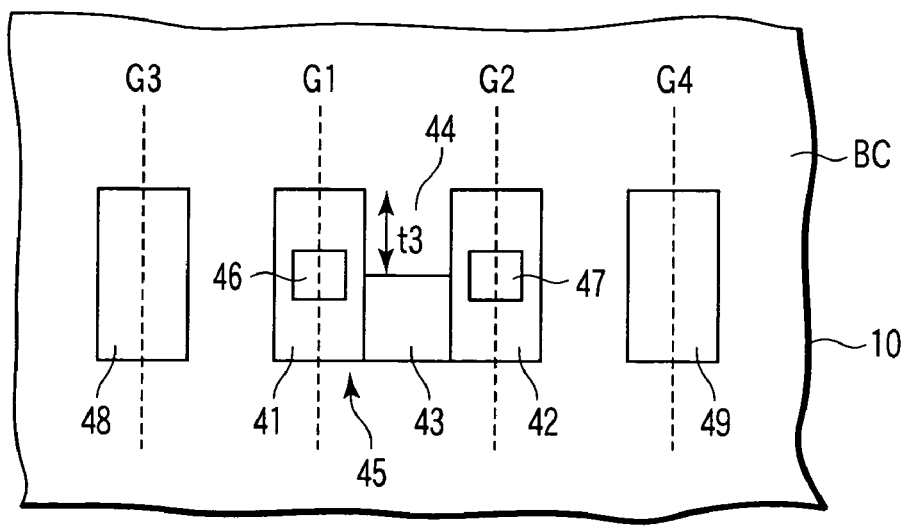
FIG. 2 is a pattern plan view of a basic cell according to a second embodiment of the present invention.

FIG. 2 is a pattern plane view of a basic cell according to a second embodiment of a master slice type semiconductor integrated circuit device of the present invention. In the basic cell according to the second embodiment, in the same way as the basic cell according to the first embodiment, a plurality of terminals respectively composed of a metal layer of the first layer are formed, the terminals being electrically connected to a source region, a drain region, and a gate electrode of a transistor.

One terminal of the plurality of terminals composed of the metal layer of the first layer is configured as follows. A first pattern 41 is arranged along the first grid line G1. A second pattern 42 composed of the metal layer of the first layer is arranged along the second grid line G2 adjacent to the first grid line G1, and is adjacent to the first pattern 41. Moreover, a third pattern 43 composed of the metal layer of the first layer, which interconnects the first and second patterns 41 and 42 at the end portions of the first and second patterns 41 and 42, is arranged between the first and second grid lines G1 and G2. A dimension of the third pattern 43 in a direction of extension of the grid lines is smaller than a dimension of the first and second patterns 41 and 42 in a direction of extension of the grid lines.

The first to third patterns 41 to 43 are arranged along the grid lines G1 and G2 adjacent to each other, and configure a terminal 45 with a large planer shape, which has a concave portion 44 in a square shape at one end portion in a direction of extension of the grid lines in a region positioned between the both grid lines G1 and G2. Namely, the concave portion 44 is formed in a region defined by the first, second, and third patterns 41 to 43. A dimension t3 of the concave portion 44 is set to be extremely greater than a correction dimension by OPC. For example, the dimension t3 of the concave portion 44 is set to be a value greater than a width of the first and second patterns 41 and 42, i.e., a dimension of the first and second patterns 41 and 42 in a direction perpendicular to the direction of extension of the grid lines.

On the first and second patterns 41 and 42, via contact formation regions 46 and 47 in which via contacts to be electrically connected to the upper layer wirings can be formed are provided.

A terminal 48 composed of the metal layer of the first layer is arranged along the grid line G3 adjacent to the grid line G1. A terminal 49 composed of the metal layer of the first layer is arranged along the grid line G4 adjacent to the grid line G2. The terminals 48 and 49 are electrically connected to, for example, the gate electrode among the source region, the drain region, and the gate electrode of the transistor in the basic cell.

In the second embodiment as well, the terminal 45 including the first to third patterns 41 to 43 has a large planar shape extending over the two grid lines. Therefore, when a logic circuit is configured by connecting the upper layer wirings of the layers on and after the second layer to the terminal 45, a degree of freedom in connections with the upper layer wirings can be sufficiently insured because the planar shape of the terminal 45 is large. In addition, the concave portion 44 is arranged between the first pattern 41 and the second pattern 42. Because the planar shape of the terminal 45 is not an H shape, influence due to rounding decreases by half as compared with an H-shaped terminal. However, even if OPC is not sufficiently performed on the terminal 45, a risk that the terminal 45 short-circuits with the terminals 48 and 49 arranged along the adjacent grid lines G3 and G4 is eliminated due to rounding.

Namely, also in the second embodiment, a degree of freedom in connections between the terminal 45 and the upper layer wirings can be insured without increase in a cell size.

Figure 3:
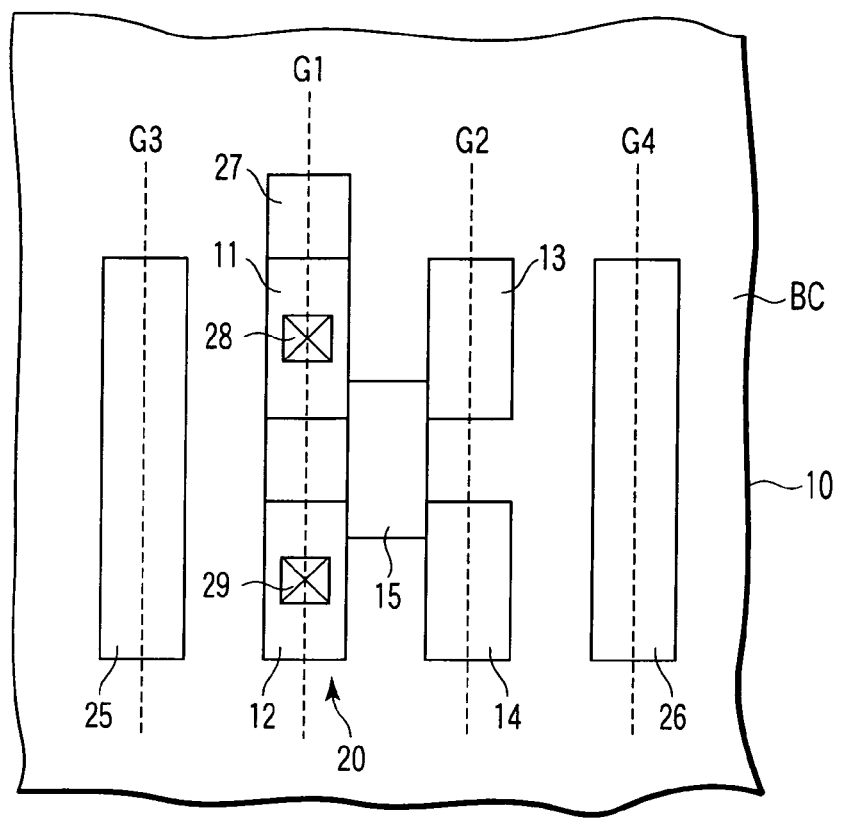
FIG. 3 is a pattern plan view showing a state in which an upper layer wiring is connected to the basic cell according to the first embodiment.

FIG. 3 is a pattern plan view showing a state in which an upper layer wiring is connected to the basic cell according to the first embodiment. Assume that, when an upper layer wiring 27 composed of a metal layer of the second layer is connected to the terminal 20, there is no need to form other upper layer wirings composed of the metal layer of the second layer on the first and second patterns 11 and 12 arranged along the grid line G1. In this case, via contacts 28 and 29 are formed at the via contact formation regions 21 and 22 at two places provided on the first and second patterns 11 and 12, and the upper layer wiring 27 can be connected at two places to the terminal 20. The via contacts 28 and 29 are formed at the via contact formation regions 21 and 22 at two places among the via contact formation regions 21 to 24 at four places provided in advance to the terminal 20, which can prevent for an yield from being deteriorated by via-open.

First Modified Example of the First Embodiment

Figure 4:
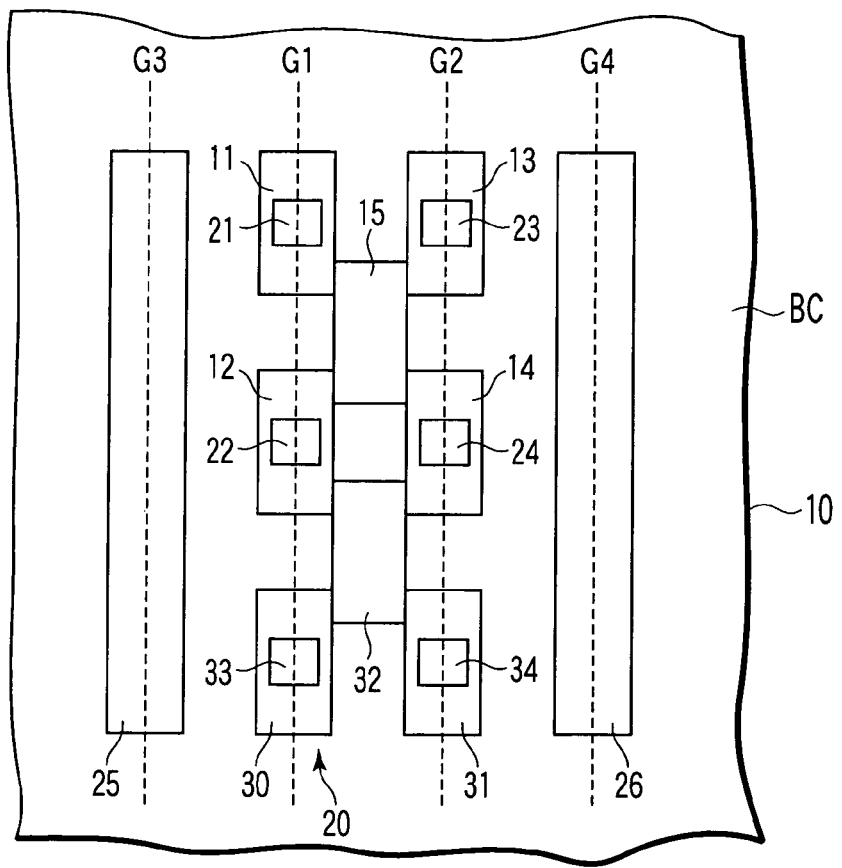
FIG. 4 is a pattern plan view of a basic cell according to a first modified example of the first embodiment.

FIG. 4 is a pattern plane view of a basic cell according to a first modified example of the first embodiment. In the first embodiment, the terminal 20 with a large planar shape is formed by the first to fifth patterns 11 to 15.

In contrast thereto, in the basic cell according to the modified example, a sixth pattern 30 composed of the metal layer of the first layer, a seventh pattern 31 composed of the metal layer of the first layer, and an eighth pattern 32 are added. The sixth pattern 30 is arranged so as to be spaced from the second pattern 12 along the first grid line G1. The seventh pattern 31 is arranged so as to be spaced from the fourth pattern 14 along the second grid line G2. The eighth pattern 32 is arranged between the first and second grid lines G1 and G2, and interconnects the second, fourth, sixth and seventh patterns 12, 14, 30 and 31. Via contact formation regions 33 and 34, which are the same as the via contact formation regions 21 to 24 provided on the first, second, third and fourth patterns, are provided on the sixth and seventh patterns 30 and 31.

In the same way as the fifth pattern 15, a dimension of the eighth pattern 32 in a direction of extension of the grid lines is smaller than a dimension obtained by adding dimensions of the second and sixth patterns 12 and 30 in a direction of extension of the grid lines to an interval between the both patterns, and a dimension obtained by adding dimensions of the fourth and seventh patterns 14 and 31 in a direction of extension of the grid lines to an interval between the both patterns.

More specifically, in the present embodiment, the sixth, seventh and eighth patterns 30, 31 and 32 which correspond to the second, fourth and fifth patterns 12, 14 and 15 in FIG. 1 are added, and the terminal 20 is enlarged in a vertical direction so as to make a planar shape larger.

Note that, when a terminal with a larger planar shape is necessary, sets of patterns only in a necessary number which correspond to the second, fourth and fifth patterns 12, 14 and 15 may be provided, and may be arranged in a vertical direction.

Also in the modified example, the same effect as that in the case of the first embodiment can be obtained, and in addition, a degree of freedom in connections with the upper layer wirings can be more insured because the planar shape of the terminal 20 can be made larger.

Second Modified Example of the First Embodiment

FIG. 5 is a pattern plane view of a basic cell according to a second modified example of the first embodiment. In the first modified example, sets of patterns only in a necessary number which correspond to the second, fourth and fifth patterns 12, 14 and 15 are provided in order to make the planar shape of the terminal 20 larger, which enlarges the terminal 20 in a vertical direction.

In contrast thereto, in the basic cell according to the modified example, sets of the patterns 30, 31 and 32 only in a necessary number which correspond to the second, fourth and fifth patterns 12, 14 and 15, or the third, fourth and fifth patterns 13, 14 and 15 are provided, and are arranged in a horizontal direction, which enlarges the planar shape of the terminal 20 in a horizontal direction.

In the second modified example as well, the same effect as that in the first modified example can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A master slice type semiconductor integrated circuit device comprising:
    a basic cell formed on a semiconductor substrate, a plurality of grid lines including first to fourth grid lines which extend in a same direction being imagined on the semiconductor substrate, the basic cell having a plurality of terminals arranged along said plurality of grid lines and respectively composed of a metal layer,
    wherein at least one terminal of said plurality of terminals includes:
    first and second patterns which are arranged on the semiconductor substrate, the first and second patterns being spaced from each other along the first grid line;

third and fourth patterns which are arranged on the semiconductor substrate, the third and fourth patterns being spaced from each other along the second grid line adjacent to the first grid line, and the third and fourth patterns being adjacent to the first and second patterns; and a fifth pattern which is arranged between the first and second grid lines, and is arranged on the semiconductor substrate interconnecting the first, second, third and fourth patterns, a dimension of the fifth pattern in a direction of extension of said plurality of grid lines being set to be smaller than a dimension obtained by adding dimensions of the first and second patterns in the direction of extension of said plurality of grid lines to an interval between the both patterns, and a dimension obtained by adding dimensions of the third and fourth patterns in the direction of extension of said plurality of grid lines to an interval between the both patterns.

2. The master slice type semiconductor integrated circuit device according to claim 1, wherein the first, second, third and fourth patterns respectively have first, second, third and fourth via contact formation regions in which via contacts to be electrically connected to upper layer wirings are formed.

3. The master slice type semiconductor integrated circuit device according to claim 1, wherein the terminal different from said at least one terminal is any one of a terminal which is arranged along the third grid line adjacent to the first grid line, and a terminal which is arranged along the fourth grid line adjacent to the second grid line.

4. The master slice type semiconductor integrated circuit device according to claim 1, further comprising:

first and second via contacts formed in the first and second via contact formation regions; and an upper layer wiring formed on the first and second patterns along the first grid line, the upper layer wiring being electrically connected to said at least one terminal via the first and second via contacts.

5. The master slice type semiconductor integrated circuit device according to claim 1, wherein said at least one terminal has a first concave portion provided among the first and second patterns and the fifth pattern, and a second concave portion provided among the third and fourth patterns and the fifth pattern, and a dimension of the first and second concave portions in a direction perpendicular to the direction of extension of said plurality of grid lines is greater than a correction dimension when said plurality of terminals are corrected by OPC.

6. The master slice type semiconductor integrated circuit device according to claim 1, wherein said at least one terminal has a first concave portion provided among the first and second patterns and the fifth pattern, and a second concave portion provided among the third and fourth patterns and the fifth pattern, and a dimension of the first and second concave portions in a direction perpendicular to the direction of extension of said plurality of grid lines is equal a dimension of the first to fourth patterns in a direction perpendicular to the direction of extension of said plurality of grid lines.

7. The master slice type semiconductor integrated circuit device according to claim 1, wherein said at least one terminal has a third concave portion provided among the first and third patterns and the fifth pattern, and a fourth concave portion provided among the second and fourth patterns and the fifth pattern, and a dimension of the third and fourth concave portions in the direction of extension of said plurality of grid lines is greater than a correction dimension when said plurality of terminals are corrected by OPC.

8. The master slice type semiconductor integrated circuit device according to claim 1, wherein said at least one terminal has a third concave portion provided among the first and third patterns and the fifth pattern, and a fourth concave portion provided among the second and fourth patterns and the fifth pattern, and a dimension of the third and fourth concave portions in the direction of extension of said plurality of grid lines is equal a dimension of the first to fourth patterns in a direction perpendicular to the direction of extension of said plurality of grid lines.

* * * * *